(12) United States Patent
Bandoh et al.

(10) Patent No.: US 8,150,784 B2
(45) Date of Patent: Apr. 3, 2012

(54) CONTROL SYSTEM AND METHOD FOR CONTROLLED OBJECT IN TIME VARIANT SYSTEM WITH DEAD TIME, SUCH AS SINGLE CRYSTAL PRODUCTION DEVICE BY CZOCHRALSKI METHOD

(75) Inventors: Kenichi Bandoh, Hiratsuka (JP); Shigeo Morimoto, Hiratsuka (JP); Takuji Okumura, Hiratsuka (JP); Tetsu Nagata, Hiratsuka (JP); Masaru Shimada, Hiratsuka (JP); Junsuke Tomioka, Hiratsuka (JP); Yutaka Shiraishi, Hiratsuka (JP); Takeshi Kodama, Hiratsuka (JP)

(73) Assignee: Sumco Techxiv Corporation, Tokyo (JP)

( * ) Notice: Subject to any disclaimer, the term of this patent is extended or adjusted under 35 U.S.C. 154(b) by 1099 days.

(21) Appl. No.: 11/989,749

(22) PCT Filed: Jun. 7, 2006

(86) PCT No.: PCT/JP2006/311395
§ 371 (c)(1),
(2), (4) Date: Jan. 31, 2008

(87) PCT Pub. No.: WO2007/020744
PCT Pub. Date: Feb. 22, 2007

(65) Prior Publication Data
US 2010/0100217 A1    Apr. 22, 2010

(30) Foreign Application Priority Data

Aug. 12, 2005 (JP) .................................. 2005-234221
Aug. 12, 2005 (JP) .................................. 2005-234240
Aug. 12, 2005 (JP) .................................. 2005-234284

(51) Int. Cl.
*G06E 1/00* (2006.01)
*G06E 3/00* (2006.01)
*G06F 15/18* (2006.01)
*G06G 7/00* (2006.01)
(52) U.S. Cl. ......................................................... 706/21
(58) Field of Classification Search ....................... None
See application file for complete search history.

(56) References Cited

U.S. PATENT DOCUMENTS
5,164,039 A    11/1992   Kawashima et al.
(Continued)

FOREIGN PATENT DOCUMENTS
DE    198 24 838    12/1999
(Continued)

OTHER PUBLICATIONS

Bandoh et al. "discrete-time sliding-mode control for processes with time delay and its application to cooling plate for semiconductor manufacturing", ICOM 2003, number of pp. 7.*

(Continued)

*Primary Examiner* — David R Vincent
*Assistant Examiner* — Li-Wu Chang
(74) *Attorney, Agent, or Firm* — Posz Law Group, PLC

(57) ABSTRACT

A device controls an object in a time variant system with a dead time such as a Czochralski method single crystal production device (CZ equipment). The dead time, time constant, and process gain value of an object (CZ equipment) are set. The process gain preset value has time variant characteristics. An output value and its first-order and second-order time differentiated values serve as the state variable. A non-linear state predicting unit predicts a state variable value at a future time, based upon the current output value, dead time, time constant, and process gain preset value. A gain scheduled sliding mode control unit performs a gain scheduled sliding mode control operation based upon the state variable value at the future time, an output deviation at the future time, the time constant, and the set value of the process gain at the future time, to determine the manipulated variable of the object.

5 Claims, 8 Drawing Sheets

U.S. PATENT DOCUMENTS

| | | | |
|---|---|---|---|
| 5,200,681 A * | 4/1993 | Hiroi | 318/610 |
| 5,246,535 A | 9/1993 | Kawashima et al. | |
| 6,082,099 A * | 7/2000 | Yasui et al. | 60/276 |
| 6,577,908 B1 * | 6/2003 | Wojsznis et al. | 700/42 |
| 6,776,840 B1 | 8/2004 | Fuerhoff et al. | |
| 2002/0143460 A1 * | 10/2002 | Yasui et al. | 701/106 |
| 2002/0173901 A1 | 11/2002 | Yoshizawa | |
| 2003/0195641 A1 | 10/2003 | Wojsznis et al. | |
| 2004/0240102 A1 * | 12/2004 | Atsumi et al. | 360/78.06 |
| 2004/0260412 A1 * | 12/2004 | Yasui et al. | 700/86 |

FOREIGN PATENT DOCUMENTS

| | | |
|---|---|---|
| DE | 600 01 274 T2 | 9/2000 |
| DE | 101 96 372 T1 | 12/2001 |
| EP | 0 445 940 A1 | 9/1991 |
| JP | A-3-259301 | 11/1991 |
| JP | 04-219338 A | 8/1992 |
| JP | A-4-219388 | 8/1992 |
| JP | 07044221 A * | 2/1995 |
| JP | A-7-044221 | 2/1995 |
| JP | 07-077996 A | 3/1995 |
| JP | 09-165293 A | 6/1997 |
| JP | 2813439 B | 8/1998 |
| JP | A-2003-192487 | 7/2003 |
| JP | A-2004-326781 | 11/2004 |

OTHER PUBLICATIONS

Bandoh Kenichi et al., "Discrete-Time Sliding-Mode Control for Processes with Time Delay and Its Application to Cooling Plate for Semiconductor Manufacturing", ICOM 2003, Loughborough, UK, Jun. 2003, pp. 191-196.

Office Action mailed Jan. 17, 2011 issued in corresponding DE patent application No. 11 2006 002 130.3-55 (English translation enclosed).

Summons to Oral Proceedings issued on Aug. 19, 2011 for DE application No. 1120062130.3 (and English translation).

"Basics of the control electronic, second edition" G. Schmidt, 1991 (and English translation).

Office Action mailed Sep. 6, 2011 in corresponding JP application No. 2005-234221 (and English translation).

Office Action mailed Sep. 6, 2011 in corresponding JP application No. 2005-234240 (and English translation).

* cited by examiner

CONTROL SYSTEM AND METHOD FOR CONTROLLED OBJECT IN TIME VARIANT SYSTEM WITH DEAD TIME, SUCH AS SINGLE CRYSTAL PRODUCTION DEVICE BY CZOCHRALSKI METHOD

TECHNICAL FIELD

The present invention relates to a control system and method for a controlled object in a time variant system with a dead time, and is appropriate for control of a process for manufacturing a single crystal ingot of some specified substance such as a semiconductor material by, for example, the Czochralski method (the "pulling method").

BACKGROUND TECHNIQUE

A process for manufacturing a single crystal ingot (a single crystal) of a specified substance, such as a semiconductor material, by the Czochralski method (the "pulling method") will be taken as a typical example of a controlled object in a time variant system with a dead time, and will be explained in the following.

It goes without saying that, in manufacture of a single crystal ingot by the Czochralski method or by another method, it is extremely important to reduce the crystal defects in the single crystal ingot. Furthermore, it is also extremely important to control the diameter of the straight body portion of the single crystal ingot fixedly to the desired value. In order better to satisfy these demands, for example, control methods such as the following have been proposed.

In Patent Document #1 a method is disclosed for, in the Czochralski method, keeping the diameter of the straight body portion of the single crystal ingot constant, and for suppressing the occurrence of polycrystals. According to this method, while pulling up the single crystal ingot and forming the straight body portion, the weight of the single crystal ingot is measured, and the current external diameter value of the single crystal ingot is calculated from this measured weight. Based upon this calculated current external diameter value, and upon the response function of a prediction model (for example, a step response model) which is set up in advance, an external diameter predicted value for the single crystal ingot after the lapse of a predetermined time period is calculated. This calculated external diameter predicted value and the specified external diameter target value are compared together and the deviation between them is calculated, and the output of the heater is controlled according to this deviation.

Moreover, a control method in which the control method disclosed in Patent Document #1 is improved is disclosed in, for example, Patent Document #2. According to this method, the time constant or gain of the response function of the prediction model described above is adjusted, so as to decrease monotonically along with the passage of time.

And, in Patent Document #3, there is disclosed a method of, in the Czochralski method, growing the increased diameter portion (the cone portion or shoulder portion) of the single crystal ingot, in order to ensure that the crystallinity of the straight body portion of the single crystal ingot is not disturbed. According to this method, while the cone portion is being grown, the rate of change of the diameter of the cone portion and the temperature of the melt are measured. The measured rate of change of the diameter of the cone portion and a target value which is set in advance are compared together, and a temperature target value is adjusted according to the difference between them. This adjusted temperature target value and the measured melt temperature are compared together, and the electrical power supplied to the heater is PID controlled according to the deviation between them.

Patent Document #1: Japanese Patent No. 2,813,439
Patent Document #2: Japanese Laid-Open Patent Publication Heisei 9-165293
Patent Document #3: Patent Publication 7-77996

SUMMARY OF THE INVENTION

Problems to be Solved by the Invention

The control method which uses the prediction models disclosed in Patent Documents #1 and #2 is used in forming the straight body portion, and is not used in the process of formation of the previous shoulder portion. On the other hand, the method disclosed in Patent Document #3, which is related to the process of formation of the shoulder portion, may be used when pulling up a small diameter single crystal ingot at extremely slow speed. However, when manufacturing a single crystal ingot of large diameter, such as for example one of diameter 200 mm or 300 mm, while pulling it up at high speed, such as when pulling up a silicon single crystal, it is difficult to form the desired shoulder portion by the method described in Patent Document #3, since, during the formation of the first half of straight body portion from the shoulder portion, unsteadiness and nonlinearity between the heater temperature and the crystal diameter appear prominently.

In this manner, according to prior art control methods, it is difficult to control at high accuracy the object in a time variant system with a dead time, such as the one which is represented by a single crystal production device by the Czochralski method.

Accordingly, the object of the present invention is to control at high accuracy the object in a time variant system with dead time.

Furthermore, another objective of the present invention is, in a single crystal production device and method according to the Czochralski method, to enhance the controllability of the diameter over both the shoulder portion and the straight body portion of the single crystal ingot, and moreover to enhance the crystalline product quality of the straight body portion.

Means for Solving the Problems

According to one aspect of the present invention, a control system for a controlled object in a time variant system with a dead time comprises: a storage device which stores a target value for an output value of the controlled object and a plurality of system parameter preset values which represent a plurality of system parameters of the controlled object, and performs setting so that all or a part of the plurality of system parameter set values have specified time variant characteristics; a state predicting unit (a nonlinear state predictor) which, based on the system parameter set values stored in the storage device, and an output value at the present time instant and an input value in the past of the system, predicts the values of a specified state variable, including the output value, at a future time instant which is later than the present by exactly the dead time; and a sliding mode control unit which, based on the target value at the future time instant stored in the storage device, the system parameter set values, and the state variables at the future time instant predicted by the state predicting unit, performs sliding mode control operation so as to constrain the state variables at the future time instant to sliding mode of the future time instant, and outputs an actuation value which is to be applied to the controlled object.

According to this control system, the plurality of system parameter set values which represent the plurality of system parameters of the controlled object (for example, dead time, time constant, and process gain) are set in advance and stored. And all or a part of these system parameter preset values are set so as to have specified time variant characteristics, in which the time variant characteristics of the controlled object are reflected. As a method for setting some of the system parameter set values so as to have time variant characteristics, for example, it is possible to arrange to set them in the format of a function of a specified progress variable which indicates the state of progress of a process, or of elapsed time. The system parameter set values which have been stored, and a current output value which is outputted from the controlled object and an input value which has been inputted to the controlled object in the past, are inputted to a state predicting unit. Based upon these input values, the state predicting unit predicts the values of a state variable of the controlled object at a future time instant which is later than the present by exactly the dead time. Here, the output value of the controlled object and its time differentiated value and the like may be included in the state variables. The deviation between the predicted output value at the future time instant and the target value at the future time instant which is set in advance is obtained. And a sliding mode control unit, based on the deviation at the future time instant and the predicted state variables at the future time instant, performs sliding mode control operation using stored the system parameter set values at the future time instant, so as to constrain the state variables at the future time instant in sliding mode of the future time instant, and determines an input value at the present time instant which is to be applied to the system. In this manner, by a combination of state prediction operation which predicts the state variable values after the dead time, and sliding mode control operation which is performed using the time variant system parameter set values, so as to constrain the predicted state variables after the dead time in sliding mode, it is possible to control the output value of the time variant controlled object which has a dead time to its target value at high accuracy.

This control system for a dead time system which has nonlinearity has a simple construction, and it constrains the predicted states in a future sliding mode; and, moreover, complicated calculations and optimization, such as in nonlinear model predictive control, are not required.

In a preferred embodiment, in addition to the structure described above, there is further included an integrator which obtains the deviation between the output value at the future time instant predicted by the state predicting unit and the target value, and obtains an integrated deviation value at the future time instant. And the sliding mode control unit is made as a type-1 servo system, and performs sliding mode control operation using an extended state variables made by appending the integrated deviation value from the integrator at the future time instant to the state variables from the state predicting unit at the future time instant. Since the steady state deviation is suppressed by doing this, accordingly the control accuracy is enhanced by a further level.

As one example of the controlled object in a time variant system with a dead time, a single crystal puller which pulls up a single crystal ingot of a specific substance by the Czochralski method may be cited. Thus, a single crystal production device according to another aspect of the present invention comprises the above described single crystal puller as a controlled object, and a control system which has the structure described above for controlling that device. With this single crystal production device, the value of the diameter of the single crystal ingot which is being pulled up by the single crystal puller is employed as the output value of the single crystal puller. It should be understood that, as the "value of the diameter" here, the value of the diameter expressed in characters would be acceptable, or the time differentiated value of the weight of the single crystal ingot which is being pulled upward (in this specification, this is termed the "pseudo diameter") would also be acceptable. Furthermore, the diameter value of the single crystal ingot and the first and second order differential values of this diameter value with respect to time may be employed as the state variables. Yet further, a numerical value for actuating the melt temperature within the crucible, or for actuating the temperature of the heater which applies heat to the melt, may be employed as the actuation value (input value) which is applied to the single crystal puller. Furthermore, it is possible to arrange to control the pulling up speed of the single crystal ingot by the single crystal puller according to a pulling up speed set value which is set in advance as a function of time. Yet further, although the dead time, the time constant, and the process gain are included in the system parameters of the single crystal puller, among these, it is possible to set at least the time constant and the process gain set value, for example, in the format of functions of the length of the single crystal ingot which is being pulled up, or of the elapsed time, so as to have specified time variant characteristics.

It is desirable for the pulling up speed set value to be one which maintains the temperature value at the interface in the crucible between the solid of the single crystal ingot and the liquid of the melt at an adequate value. Moreover, the process gain set value may be set so as to change according to the length of the single crystal ingot in the processes of formation of the shoulder portion and of the straight body portion of the single crystal ingot, and in particular may be set so as to change according to the change of the pulling up speed of the single crystal ingot in the process of formation of the straight body portion. With a control system which is applied to the single crystal puller in this format, the controllability of the diameter of the single crystal ingot is enhanced both in the shoulder portion and in the straight body portion, and moreover the crystal product quality in the straight body portion is enhanced.

According to yet another aspect of the present invention, a control system for a controlled object in a time variant system with a dead time comprises: a storage device which stores a target value for an output value of the controlled object and control gain set values including a proportional gain set value, an integration gain set value, and a differential gain set value, and performs setting so that, among the control gain set values, at least the proportional gain set value has specified time variant characteristics; a feed forward compensator which outputs a first actuation value which is set in advance so as to have specified time variant characteristics; a subtractor which calculates a deviation between the target value stored in the storage device and the output value from the controlled object; a gain scheduled PID control unit which performs PID control operation based upon the deviation from the subtractor and the control gain set values which are stored in the storage device, and outputs a second actuation value; and a compositor which inputs the first actuation value from the feed forward compensator and the second actuation value from the gain scheduled PID control unit, and outputs a third actuation value which is to be applied to the controlled object.

According to this control system, the feed forward compensator outputs the first actuation value, which is set in advance so as to have specified time variant characteristics (for example in the format of a function of the state of progress of process, or of elapsed time). For this first actuation value, there may be employed an actuation values which is obtained experimentally, with the objective of controlling the output value of the controlled object to its target value. Apart from this feed forward compensator, the gain scheduled PID control unit which outputs the second actuation value is also provided. The control gains such as the proportional gain, the integration gain, the differential gain or the like which are used by this gain scheduled PID control unit are set in advance and stored. These control gain set values may be determined based upon the system parameters of the controlled object which have been adjusted in advance, and, among them, at least the proportional gain set value is set so as to have specified time variant characteristics, in which the time variant characteristics of the system parameters of the controlled object are reflected (for example in the format of functions of the state of progress of process, or of elapsed time). The gain scheduled PID control unit performs gain scheduled PID control operation upon the deviation between the output value of the controlled object and its target value, using a control gain set value which includes the proportional gain set value having specified time variant characteristics, and outputs the second actuation value. The first actuation value and the second actuation value are combined together to produce the third actuation value, and the third actuation value is applied to the controlled object. In this manner, the first actuation value which is set in advance is corrected with the second actuation value which is obtained by gain scheduled PID control operation in which the time variant characteristics of the control object are reflected, and the controlled object is actuated by this corrected actuation value (i.e. by the third actuation value). By doing this, it is possible to control the output value of the controlled object in time variant system which has a dead time with high accuracy.

The second type of control system according to the present invention as described above can be applied, not only to a single crystal puller which employs the Czochralski method, but also to other types of dead time system with nonlinearity.

According to yet another aspect of the present invention, a device for manufacturing a single crystal ingot of a specified substance by the Czochralski method comprises a puller which pulls up a single crystal ingot from a melt of a specific substance while applying heat to the melt with a heater, and a controller which controls the puller. The controller stores in advance a model which includes a plurality of types of coefficient set values which represent transfer characteristics between the input and the output when inputting the heater temperature or the melt temperature in the puller and outputting the diameter of the single crystal ingot. Here, at least one type of coefficient set value which is included in the model is set so as, in the process of formation of the shoulder portion and the straight body portion of the single crystal ingot, to change according to the length of the single crystal ingot or the elapsed time. And, based upon the model, the controller performs feedback control operation so as to control the diameter of the shoulder portion and of the straight body portion of the single crystal ingot which is being pulled up by the puller to a specified target value, and actuates the heater or the temperature of the melt. Here, as the "diameter", the diameter expressed in characters would be acceptable, or the time differentiated value of the weight of the single crystal ingot which is being pulled upward (in this specification, this is termed the "pseudo diameter") would also be acceptable.

According to this single crystal production device, the model of the transfer characteristics between the heater temperature (or the melt temperature) in the puller and the single crystal ingot diameter is set so as, in the process of formation of the shoulder portion and the straight body portion of the single crystal ingot, to change according to the length of the single crystal ingot or the elapsed time, and feedback control of the heater temperature (or of the melt temperature) is performed based upon this model. Due to this, the controllability of the diameter of the single crystal ingot during the process of formation of its shoulder portion and its straight body portion, is enhanced, and the crystal product quality of the straight body portion is enhanced.

The pulling up speed of the single crystal ingot by the puller may be actuated so as to agree with a pulling up speed set value which is set in advance. Here, the pulling up speed set value may be set so as to change, in the process of formation of the shoulder portion and of the straight body portion of the single crystal ingot, according to the length of the single crystal ingot or according to the elapsed time. Desirably, the pulling up speed set value is set so that the temperature gradient at the interface between the solid of the single crystal ingot and the liquid of the melt is maintained at an almost adequate value. By doing this, the control accuracy of the crystal product quality of the single crystal ingot is enhanced.

In a preferred embodiment, gain scheduled sliding mode control operation based upon the model is employed as the feedback control operational method. By doing this, the adaptability and the robustness of the system with regard to nonlinear and time variant characteristics are enhanced, and the control accuracy for the diameter of the single crystal ingot and its crystal product quality are improved by a further level.

Moreover, based upon the model, it is possible to arrange to perform the sliding mode control operation so as to predict the value of a state variable of the single crystal ingot at a future time instant which is later than the present by just the dead time of the transfer characteristic described above, and so as to constrain the predicted state variables at the future time instant in sliding mode. By doing this, high control accuracy is obtained even if the dead time is large.

In a preferred embodiment, in the model described above, there are included a dead time and a plurality of coefficient set values which represent primary delay elements—for example a dead time set value, a time constant set value, and a process gain set value. In the process of formation of the shoulder portion and the first half portion of the straight body portion of the single crystal ingot, all of the dead time set value, the time constant set value, and the process gain set value are set so as to change according to the length of the single crystal ingot, and thereafter, in the process of formation of the rear portion of the straight body portion, the process gain set value is set so as to change along with change of the pulling up speed, which corresponds to the length of the single crystal ingot. By performing the above described gain scheduled sliding mode control operation using this kind of model, and by controlling the heater temperature (i.e. the melt temperature), it is possible to obtain extremely good control accuracy for the diameter of the single crystal ingot, and for its crystal product quality.

In a preferred embodiment, the model described above is derived by a recursive identification technique by taking the time differentiated value of the weight of the single crystal ingot which has been pulled up as an output and the command value of the temperature of the heater or of the melt as an input. Here, the command value for the temperature takes, as an equilibrium point, the shoulder start temperature, which is the temperature when dislocation is eliminated from the growing portion of the crystal in the necking process.

According to yet another aspect of the present invention, a method for manufacturing a single crystal ingot of a specific substance by the Czochralski method comprises: a step of pulling up, with a puller, a single crystal ingot from a melt of a specific substance, while applying heat to the melt with a heater; and a step of controlling the puller. In the controlling step, a model is stored in advance which includes a plurality of types of coefficient set values which represent transfer characteristics of the puller; and at least one type of coefficient set value which is included in the model is set so as, in the process of formation of the shoulder portion and the straight body portion of the single crystal ingot, to change according to the length of the single crystal ingot or the elapsed time. And, based upon this model, feedback control operation is performed so as to control the diameter of the shoulder portion and the straight body portion of the single crystal ingot which is being pulled up by the puller to a specified target value, and the heater or the temperature of the melt is actuated.

According to even yet another aspect of the present invention, a device for manufacturing a single crystal ingot of a specific substance by the Czochralski method comprises a puller which pulls up a single crystal ingot from a melt of a specific substance, while applying heat to the melt with a heater; and a controller which controls the puller. The controller stores control gain set values for proportional, integration, and differential operation. These control gain set values are desirably set, based upon a model of transfer characteristics of the puller, so that at least one type of control gain set value changes, during the process of formation of a shoulder portion and of a straight body portion of the single crystal ingot, according to the length of the single crystal ingot or the elapsed time. The controller generates a first temperature actuation value which is set in advance as a function of the length or the elapsed time. Simultaneously, based upon the control gain set values, in the process of formation of the shoulder portion and of the straight body portion of the single crystal ingot which is being pulled up by the puller, the controller performs gain scheduled PID operation so as to control the weight or the diameter of the single crystal ingot to a specified target value, and generates a second temperature actuation value. And the controller generates a third temperature actuation value by combining the first and second temperature actuation values, and actuates the temperature of the heater or of the melt according to the third temperature actuation value. Here, as the first temperature actuation value, a temperature actuation value may be set which is known to be experimentally almost adequate. This first temperature actuation value is corrected with the second temperature actuation value from gain in scheduled PID control operation, and temperature actuation is performed with the corrected temperature actuation value (the third temperature actuation value). By doing this, the control accuracy for the diameter and the crystal product quality during the process of forming both the shoulder portion and the straight body portion of the single crystal ingot is enhanced.

In a preferred embodiment, all of the proportion, integration, and differential gain set values are set so as to change, in the process of formation of the shoulder portion and in the process of formation of the first half portion of the straight body portion, according to the length of the single crystal ingot.

The pulling up speed of the single crystal ingot may be actuated so as to agree with a pulling up speed which is set in advance. The pulling up speed set value is set so as to change, in the process of formation of the shoulder portion and the straight body portion of the single crystal ingot, according to the length of the single crystal ingot, or according to the elapsed time. Desirably, the pulling up speed set value is set so that the temperature gradient at the interface between the solid of the single crystal ingot and the liquid of the melt is maintained at an almost adequate value. By doing this, the crystal product quality of the single crystal ingot is enhanced by yet a further level.

According to still another aspect of the present invention, a method for manufacturing a single crystal ingot of a specific substance by the Czochralski method includes a step of pulling up a single crystal ingot from a melt of a specific substance with a puller while applying heat to the melt with a heater, and a step of controlling the puller. In the control step, control gain set values (Kp, TI, TD) for proportional, integration, and differential operation, are set in advance and stored. At least one type of control gain set value is set so as to change, during the process of formation of a shoulder portion and of a straight body portion of the single crystal ingot, according to the length of the single crystal ingot or the elapsed time. While the task of pulling up is being performed, a first temperature actuation value is generated which is set in advance as a function of the length or the elapsed time. Simultaneously, based upon the above described control gain set values, in the process of formation of the shoulder portion and of the straight body portion of the single crystal ingot which is being pulled up by the puller, performing gain scheduled PID operation is performed so as to control the weight or the diameter of the single crystal ingot to a specified target value, and a second temperature actuation value is generated. And the first and second temperature actuation values are combined so as to generate a third temperature actuation value, and the temperature of the heater of the puller or of the melt is actuated according to this third temperature actuation value. Here, as the first temperature actuation value, a temperature actuation value may be set which is known to be experimentally almost adequate. This first temperature actuation value is corrected with the second temperature actuation value from gain in scheduled PID control operation, and temperature actuation is performed with the corrected temperature actuation value (the third temperature actuation value).

According to still yet another aspect of the present invention, a device for manufacturing a single crystal ingot of a specific substance by the Czochralski method comprises: a puller which pulls up a single crystal ingot from a melt of a specific substance, while applying heat to the melt with a heater; and a controller which controls the puller. And the controller, in the process of formation of a shoulder portion of the single crystal ingot and in the process of formation of a first half portion of a straight body portion thereof, decreases the heater temperature or the melt temperature in the puller, along with increase of the length of the single crystal ingot or of the elapsed time; and, partway through the process of decreasing the heater temperature or the melt temperature, temporarily elevates the heater temperature or the melt temperature at least once.

With this single crystal production device, in the process of progressively decreasing the heater temperature (the melt temperature) during the process of formation of the shoulder portion and the first half of the straight body portion, the heater temperature (i.e. the melt temperature) is temporarily elevated at least once. By doing this, it is possible to form the shoulder portion of the single crystal in a satisfactory shape, and furthermore it is possible to enhance the diameter and the crystal product quality of the straight body portion of the single crystal ingot.

Gain scheduled sliding mode control operation or gain scheduled PID operation may be employed for actuating the above described heater temperature or melt temperature. Or, it would also be acceptable to actuate the heater temperature or the melt temperature according to a temperature change pattern set value which is set in advance, so that, in said process of formation of said shoulder portion and said first half portion of said straight body portion, said temperature changes in accordance with the length of said single crystal ingot or the elapsed time.

The pulling up speed of the single crystal ingot may be actuated so as to agree with a pulling up speed set value which is set in advance. Here, the pulling up speed set value may be set so as, in the process of formation of the shoulder portion and of the straight body portion of the single crystal ingot, to change according to the length of the single crystal ingot or the elapsed time. Desirably, the pulling up speed set value is set so that the temperature gradient at the interface between the solid of the single crystal ingot and the liquid of the melt is maintained at an almost adequate value. By doing this, the control accuracy of the crystal product quality of the single crystal ingot is enhanced.

According to yet another aspect of the present invention, a method for manufacturing a single crystal ingot of a specific substance by the Czochralski method comprises: a step of applying heat to a melt of a specific substance with a heater; a step of pulling up a single crystal ingot from the melt; a step of, in the process of formation of a shoulder portion of the single crystal ingot and in the process of formation of a first half portion of a straight body portion thereof, decreasing the heater temperature or the melt temperature, along with increase of the length of the single crystal ingot or of the elapsed time; and a step of, partway through the step of decreasing the heater temperature or the melt temperature, temporarily elevating the heater temperature or the melt temperature at least once.

EXPLANATION OF THE REFERENCE SYMBOLS

Figure 1:
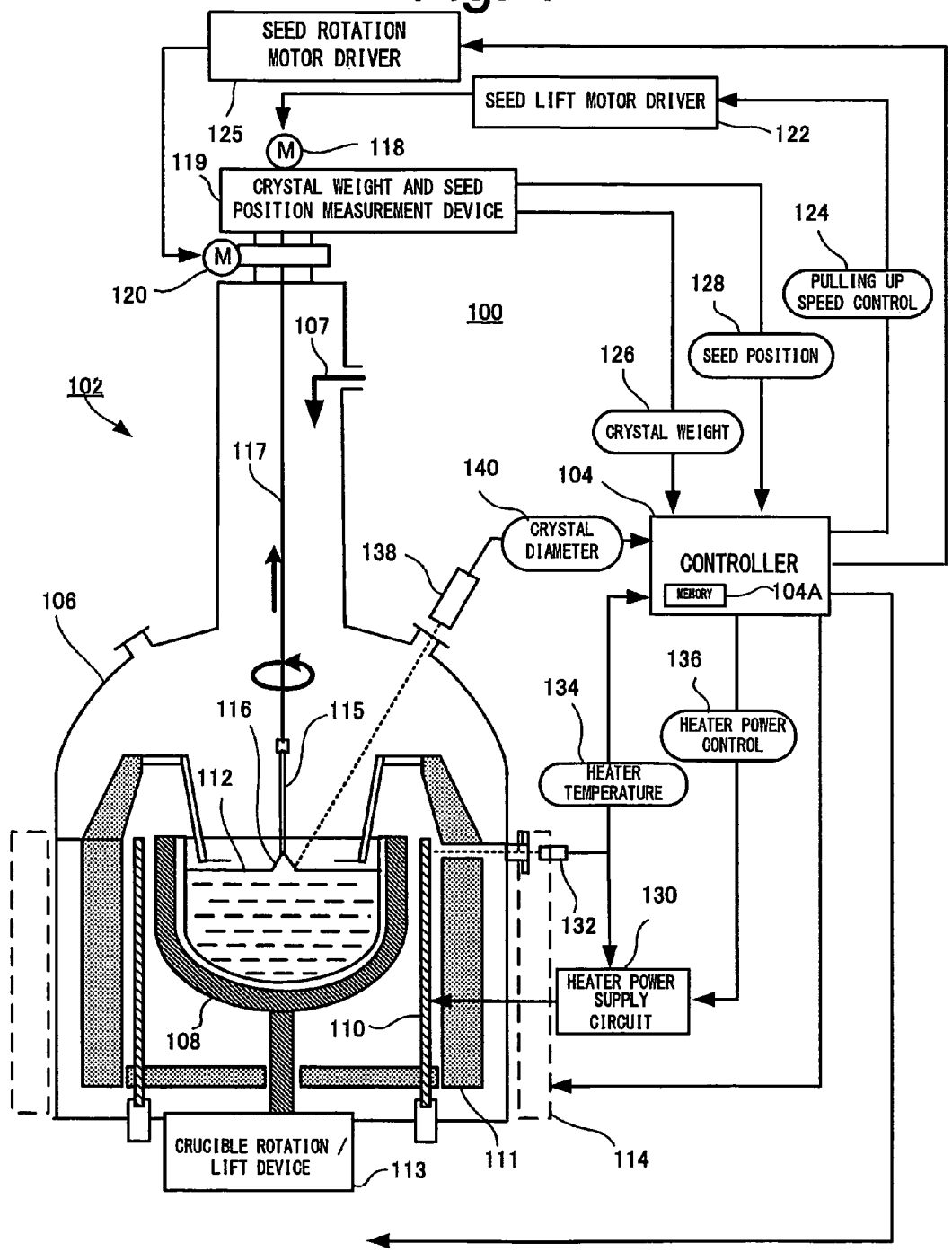
FIG. 1 is a figure showing the overall structure of a single crystal production device to which an embodiment of the present invention has been applied.

100: single crystal production device
102: Czochralski method single crystal puller furnace (CZ equipment)
104: controller

106: chamber
108: crucible
110: heater
112: melt
113: crucible rotation/lift device
114: magnetic field generation device
116: single crystal ingot
118: seed lift motor
119: crystal weight and seed position measurement device
130: heater power supply circuit
200 controlled object (CZ equipment)
202 pulling upward speed setting device
204: inexact differentiator
206: nonlinear state predicting unit
208: subtractor
210: integrator
212: gain scheduled SMC (sliding mode control) device
220: feed forward temperature compensator
230: low pass filter
232: subtractor
234: inexact differentiator
236: gain scheduled PID control unit
300: controlled object
302: nonlinear state predicting unit
304: subtractor
306: integrator
308: gain scheduled SMC (sliding mode control) device

PREFERRED EMBODIMENTS FOR CARRYING OUT THE INVENTION

In the following, several embodiments of the present invention will be explained with reference to the drawings.

FIG. 1 shows the overall structure of an embodiment of a single crystal production device for manufacturing a single crystal ingot of some specified substance, such as for example silicon, by the Czochralski method, to which the present invention has been applied.

As shown in FIG. 1, this single crystal production device 100 comprises a furnace of a single crystal puller according to the Czochralski method (hereinafter abbreviated as "CZ equipment"), and a controller 104 which controls the operation of this CZ equipment 102. This controller 104 comprises a computer which performs control calculations as will be described hereinafter, and various types of electrical and electronic circuits, which are various types of input and output interface between this computer and the CZ equipment 102 or the operator.

The CZ equipment 102 comprises a chamber 106, and the air in this chamber 106 is exhausted by a vacuum pump not shown in the figures, with an inactive gas 107 such as argon or the like being supplied at a predetermined flow amount into the interior of the chamber 106. A crucible 108 is installed within the chamber 106, and a heater 110 for applying heat to the crucible 108 is disposed around the periphery of the crucible 108, with a heat insulator 111 surrounding these from the exterior. A magnetic field generation device 114 is provided around the exterior of the chamber 106 so as to surround these elements, and this provides a magnetic field within the crucible 108. A raw material, for example silicon, is put into the crucible 108, and this is heated up by the heater 110 so as to constitute a melt 112. The crucible 108 is rotated horizontally by a crucible rotation/lift device 113, and is elevated so as to maintain the height of the liquid surface of the melt 112 constant.

A seed 115 is dangled downwards from the upper portion of the CZ equipment 102 by a wire 117. A seed lift motor 118 which is disposed in the upper portion of the CZ equipment 102 actuates this wire 117, and pulls the seed 115 upwards at a predetermined speed, after the seed has been dipped into the melt 112 within the crucible 108. Furthermore, a seed rotation motor 120 actuates the wire 117, and rotates the seed 115 at a predetermined speed. The pulling up speed and the rotational speed of the seed 115, the temperature of the heater 110 (i.e. the temperature of the melt 112), and the rotational speed of the crucible 108 and the like, are controlled by the controller 104. By doing this, along with the pulling up of the seed 115, a single crystal ingot 116 is formed below the seed 115.

While this pulling upwards is being performed, a crystal weight and seed position measurement device 119, which is provided at the upper portion of the CZ equipment 102, measures the weight of the single crystal ingot 116 (from which the diameter of the single crystal ingot 116 can be ascertained) and the position of the seed (from which the length of the single crystal ingot 116 can be ascertained), and supplies a crystal weight signal 126 and a seed position signal 128 to the controller 104. Furthermore, an optical heater temperature detector 132, which is disposed at a window of the chamber 106 for observing the heater 110, measures the temperature of the heater 110, and supplies a heater temperature signal 134 to the controller 104. Moreover, an optical diameter measurement device 138, which is disposed at a window of the chamber 106 for observing the single crystal ingot 116, measures the diameter of the single crystal ingot 116, and outputs a crystal diameter signal 140 to the controller 104. In this embodiment, the diameter of the single crystal ingot 116 is fundamentally calculated based upon the crystal weight signal 126, but, for the small diameter at the time of initial pulling up (for example a diameter less than or equal to 40 mm) for which it is difficult to ascertain the diameter of the single crystal ingot 116 with good accuracy based upon the crystal weight signal 126, this diameter may be measured with the diameter measurement device 138 instead. It should be understood that, as a variant example, it would also be acceptable to arrange to measure the diameter with the diameter measurement device 138 from start to finish.

The controller 104 inputs the above described crystal weight signal 126, seed position signal 128, heater temperature signal 134, and crystal diameter signal 140, and performs control operation as will be described in detail hereinafter, using the values of those signals. As a result of this control operation, the controller 104 outputs a pulling up speed control signal 124 to a seed lift motor driver 122, and thereby controls the speed of pulling up of the single crystal ingot 116 by the seed lift motor 118. Furthermore, as a result of this control operation, the controller 104 outputs an heater power control signal 136 to a heater power supply circuit 130 and controls the electrical power supplied to the heater 110, and thereby controls the temperature of the heater 110. Moreover, the controller 104 controls the speed of rotation of the single crystal ingot 116 by the seed rotation motor 120, the rotational speed and the lift speed of the crucible 108 by the crucible rotation/lift device 113, and the flow amount of the argon 107. If the CZ equipment 102 incorporates a magnetic field generation device 114, as in this embodiment, then the controller 104 also controls the intensity of the magnetic field produced by the magnetic field generation device 114.

Specific process conditions are set in the controller 104 in advance. Among the main variables which are included in these process conditions are the rotational speed and the pulling up speed of the single crystal ingot 116, the rotational speed of the crucible 108, the flow amount of the argon 107, the intensity of the magnetic field, and so on. The values of these process condition variables may each be set in the controller 104 as a function (in particular, a nonlinear function) of the length through which the single crystal ingot 116 has been pulled upward (or of the elapsed time from starting the pulling upward) (accordingly, as a time series of values which change in correspondence to the single crystal ingot length or the elapsed time) (it would also be acceptable to arrange to set a portion of these variables as fixed values). The behavior of the change of the set value of the pulling up speed, according to the elapsed time or the single crystal ingot length, is chosen so as to maintain the temperature gradient at the interface between the solid single crystal ingot 116 and the liquid melt 112 (the temperature gradient in the vertical direction at the interface) at an adequate value. While the pulling up of the single crystal ingot 116 is being performed, the controller 104 variably controls the above described process condition variables according to the single crystal ingot length (or the elapsed time), so that each of them attains its set value.

In addition to controlling the procession conditions according to the setting method described above, the controller 104 controls the temperature of the heater 110 (and by extension the temperature of the melt 112) by a "sliding mode control with nonlinear state predictor" method that will hereinafter be described in detail (hereinafter "sliding mode control" will be abbreviated as "SMC"). This control operation for the heater temperature (the melt temperature) is, fundamentally, performed so as to control the weight differential value, which is the weight of the single crystal ingot 116 differentiated by time, to a target value which has been set in advance. Here, the above described weight differential value is a variable which corresponds to the diameter of the single crystal ingot 116 if the pulling up speed is constant, and hereinafter this will be termed the "pseudo-diameter".

So called "nonlinear state prediction" operation and so called "gain scheduled SMC" operation are included in the control operation for the heater temperature (the melt temperature) according to the SMC Method with nonlinear state predictor. In this nonlinear state prediction operation, what value the state variable vector (in other words, the set of the three state variables consisting of the pseudo diameter itself, its first order differential value with respect to time, and its second order differential) will become at the future time instant after the dead time has elapsed from the present time instant, is predicted in consideration of the long dead time possessed by the CZ equipment 102 which is the controlled object. And gain scheduled SMC operation is performed upon the present heater temperature (melt temperature), so that the pseudo diameter at the above described future time instant which has been predicted is made to agree with a target value for the pseudo diameter at the above described future time instant.

In this gain scheduled SMC operation, the time variant characteristics are considered of a plurality of system parameters (the process gain, the time constant, and the dead time) which the CZ equipment 102, which is the controlled object, possesses (for example, in the process of forming the first portion of the straight body portion of the single crystal ingot from its shoulder portion, the process gain changes prominently, and the time constant changes). In other words, all of the system parameters (the process gain, the time constant, and the dead time) or a portion thereof (above all, the process gain and the time constant) are each set in advance as a nonlinear function of the single crystal ingot length (or of the elapsed time) so as to have specified time variant characteristics (it should be understood that, in this embodiment, as will be described hereinafter, only the dead time is set to a constant value (Ld) which is not a time variant value, but this is only a mere example for explanation, and the dead time may also be set to a time variant value as well, just like the process gain and the time constant). And, using the set values of the time variant system parameters at the above described future time instant, which have been set in advance, the SMC calculation is performed, and a current actuation value for the heater temperature (the melt temperature) is determined, so as to constrain the state variable vector at the above described future time instant, which has been predicted by the above described nonlinear state prediction operation, in sliding mode at that future time instant.

The control of the heater temperature (the melt temperature) by a SMC method with nonlinear state predictor, which has been explained in outline above, will be explained in more detail in the following.

Figure 2:
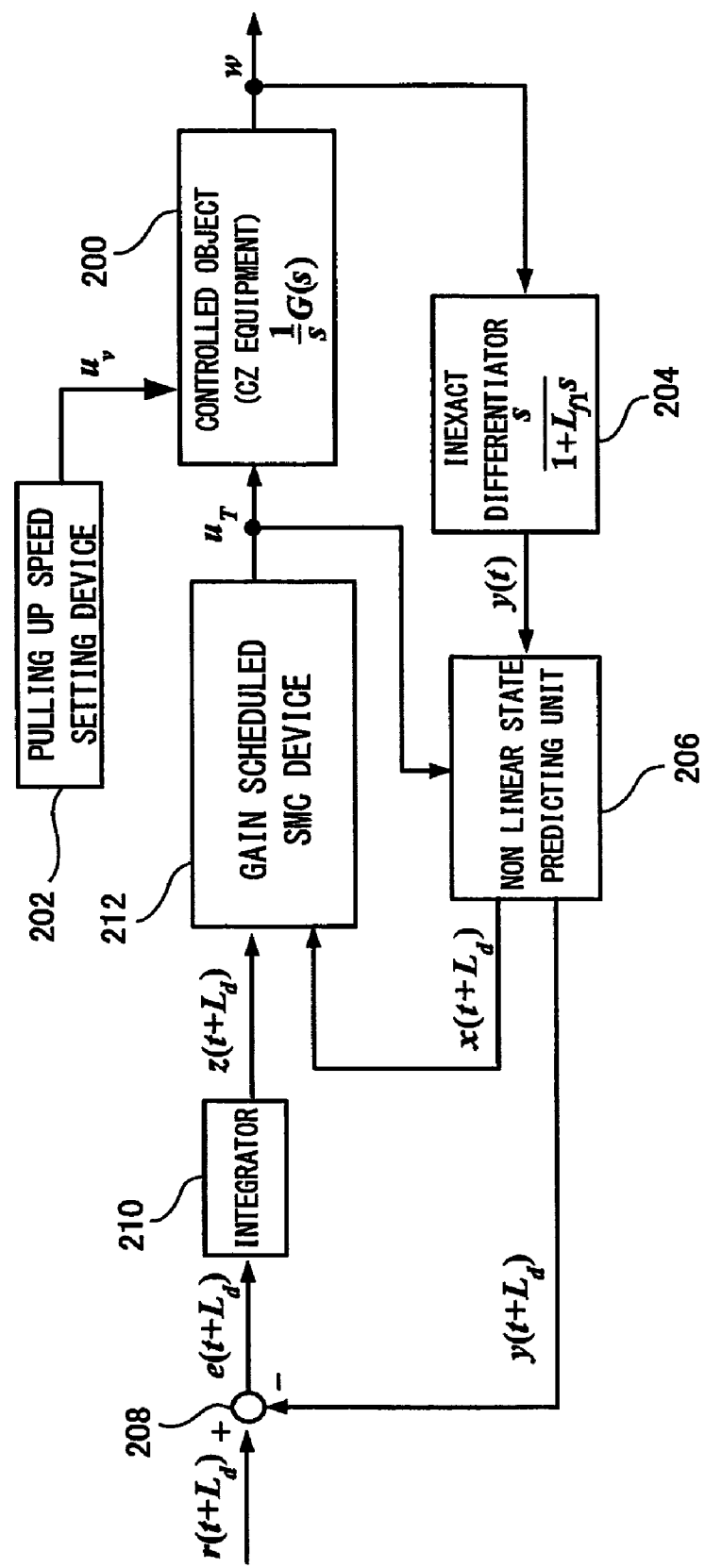
FIG. 2 is a block diagram showing the overall structure of a control system for sliding mode control with nonlinear state predictor of the melt temperature, performed by a controller 104.

FIG. 2 shows the overall structure of a control system for performing control of the heater temperature (the melt temperature) according to a SMC method with nonlinear state predictor.

In FIG. 2, the block 200 represents the controlled object (in other words, the CZ equipment 102 shown in FIG. 1). The other blocks 202 through 212 represent control operations executed by the controller 104. In other words, the controller 104 operates as a pulling up speed setting device 202, an inexact differentiator 204, a nonlinear state predicting unit 206, a subtractor 208, an integrator 210, and a gain scheduled SMC device 212. It should be understood that the controller 104 does not only control the heater temperature (the melt temperature); while it performs the above described control of the various process condition variables in parallel, in FIG. 2, only its function is shown for controlling the pulling up speed, among these process condition variables, and the functions for controlling the other such variables are omitted from this figure. The system parameters of the controlled object 200 (the process gain $k_0$, the time constant T, and the dead time L) are set in advance and stored in the controller 104. In this embodiment, because the CZ equipment 102 of FIG. 1, which is the controlled object, has transfer characteristics which are, so to speak, accidental, consequently the process gain k0 and the time constant T are set so as each to have specified time variant characteristics, while on the other hand the dead time L is set to a constant value Ld. However, this is only shown by way of example; it would be possible for all of the process gain $k_0$, the time constant T, and the dead time $L_d$ to be matched to the characteristics of the controlled object, and to be set so as to have time variant characteristics.

As shown in FIG. 2, the pulling up speed setting device 202 changes the pulling up speed of the single crystal ingot 116 corresponding to the single crystal ingot length (or the elapsed time), according to the set value of the pulling up speed which is set as a nonlinear function of the single crystal ingot length (or of the elapsed time). As already explained, the behavior of change of the set value of the pulling up speed according to the single crystal ingot length (or the elapsed time) is chosen so as to keep the temperature gradient at the interface between the solid single crystal ingot 116 and the liquid melt 112 at an adequate value. Generally, the density of crystal defects which appear within the single crystal ingot 116 which has been pulled up is determined by the temperature gradient at the above described interface and the growth speed of the crystal. By maintaining the temperature gradient at the above described interface at an adequate value while the single crystal ingot 116 is being pulled up, it is simple to manufacture a single crystal ingot 116 of a high product quality while suppressing the occurrence of crystal defects.

The inexact differentiator 204 inputs the detected crystal weight w (the crystal weight signal 126 shown in FIG. 1) from the controlled object (the CZ equipment) 200, and calculates the first order differential value of the crystal weight with respect to time t at the present time instant. As previously described, this first order differential value of the crystal weight w with respect to time t corresponds to the diameter of the single crystal ingot 116 if the pulling up speed is constant, is termed the "pseudo diameter" in this specification, and will be denoted by the symbol y(t) in FIG. 2. Now, the inexact differentiator 204 does not perform perfect differentiation with respect to the crystal weight w when calculating the pseudo diameter y(t), but performs low pass filter inexact differentiation having a specified time constant $L_{f1}$. By doing this, the influence of noise included in the detected crystal weight w (the crystal weight signal 126) is eliminated.

The nonlinear state predicting unit 206 forecast calculates the state variable vector x(t+Ld) related to the pseudo diameter at the future time instant (t+$L_d$) after the specified dead time $L_d$ has elapsed from the present time instant, by inputting the pseudo diameter y(t) at the present time instant and the actuation value $u_T$ of the heater temperature (the melt temperature), and using the set values of the system parameters (the process gain $k_0$, the time constant T, and the dead time $L_d$) which are stored in advance. Here, the state variable vector x(t+$L_d$) consists of the set of the three state variables: the pseudo diameter y(t+$L_d$) at the future time instant (t+$L_d$) after the dead time $L_d$, the first order differential y'(t+$L_d$) with respect to time of this pseudo diameter y(t+$L_d$), and the second order differential y''(t+$L_d$) thereof (or, to put it in another manner, of the set of the first order differential with respect to time of the crystal weight w(t+$L_d$) at the future time instant (t+$L_d$), its second order differential, and its third order differential).

The subtractor 208 inputs the pseudo diameter y (t+$L_d$) at the future time instant (t+$L_d$) predicted by the nonlinear state predicting unit 206 and a target value r (t+$L_d$) for the pseudo diameter at that future time instant (t+$L_d$), and calculates the deviation e(t+$L_d$) between the target value r(t+$L_d$) and the pseudo diameter y(t+$L_d$). Here, the target value r(t+$L_d$) for the pseudo diameter is set and stored in advance in the controller 104 as a nonlinear function of the length through which the single crystal ingot 116 has been pulled up (or of the elapsed time after the start of pulling up).

The integrator 210 inputs the deviation e(t+$L_d$) from the subtractor 208, integrates this deviation e(t+$L_d$) over time, and obtains an integrated value z(t+$L_d$) of the deviation e(t+$L_d$) which has been outputted from the subtractor 208 during the interval from the start of pulling upward until the present time instant.

The gain scheduled SMC device 212 inputs the state variable vector x(t+$L_d$) from the nonlinear state predicting unit 206 and the integrated value z(t+$L_d$) of the deviation e(t+$L_d$) from the integrator 210, executes an SMC operation of the type-1 servo system in which the integrated deviation value z(t+$L_d$) is added on to the state variable vector x(t+$L_d$) as a state variable by using the set values stored in advance of the system parameters (the process gain $k_0$, the time constant T, and the dead time $L_d$) at the future time instant (t+$L_d$), and thereby determines an actuation value $u_T$ for the heater temperature (i.e. the melt temperature). This actuation value $u_T$ specifies the temperature deviation from the heater temperature at the start of pulling up to the target value for the heater temperature at the present time instant. As shown in FIG. 1, an heater power control signal 136 which corresponds to the above described actuation value $u_T$ is supplied from the controller 104 to the heater power supply circuit 130, and thereby control is exerted so that the actual heater temperature (the melt temperature) agrees with the target value for heater temperature (i.e. melt temperature) which is designated by the above described actuation value $u_T$.

Next, a concrete example of a control system for the heater temperature (the melt temperature) according to the SMC method with nonlinear state predictor shown in FIG. 2 will be explained in a further layer of detail.

1. Modeling of the Controlled Object 200

The mechanism of crystal growth is extremely complicated, and a model cannot be derived from physical laws. However, it is possible to derive a model for the controlled object 200 by applying the extended least-squares method to input and output data which have been obtained in an identification experiment.

1.1 Identification Experiment

Figure 3:
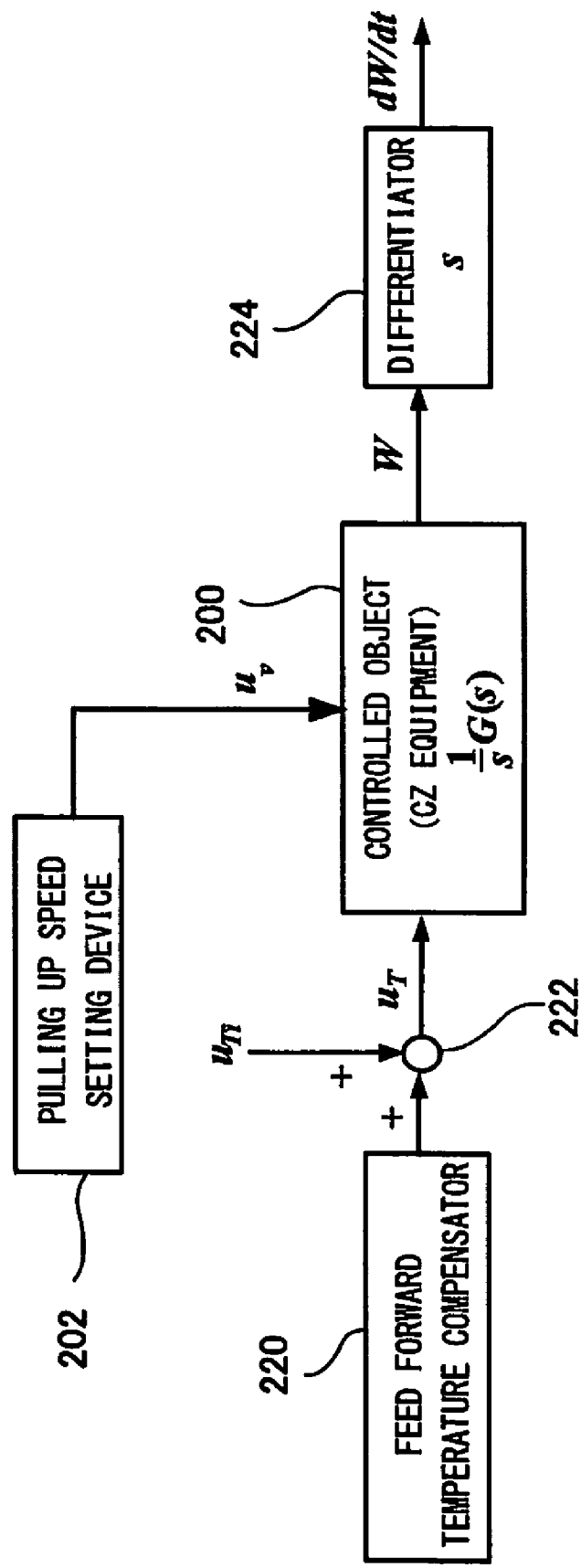
FIG. 3 is a block diagram showing the structure of an identification system for modeling a controlled object 200.

In order to ascertain the accurate operational characteristics during the pulling upward process, an identification experiment may be performed using a closed loop identification system of the type shown in FIG. 3. With the identification system shown in FIG. 3, in the state in which PID control of the pulling upward speed and the melt temperature has been eliminated, a feed forward compensation signal is outputted from the feed forward temperature compensator 220, and furthermore an identification input signal $u_{Ti}$ is manually inputted, these two signals are added together to obtain an actuation value $u_T$ for the heater temperature (i.e. the melt temperature), and the heater temperature (i.e. the melt temperature) is actuated according to this actuation value $u_T$. And a single crystal ingot 116 is pulled upwards at a pulling up speed according to a pulling up speed set value which is a nonlinear function of the single crystal ingot length (or of the elapsed time), supplied from a pulling up speed setting device 202 similar to the one shown in FIG. 2. Here, the feed forward compensation signal described above is an actuation value for the heater temperature (i.e. the melt temperature) which is set in advance, and which is obtained experimentally, in order to control the diameter of the single crystal ingot 116 to the specified target value. However, it is difficult to maintain the diameter of the single crystal ingot 116 at the specified target value, only with the above described feed forward compensation signal. Thus, in order to adjust the above described feed forward compensation signal to a more adequate value, the identification input signal $u_{Ti}$ is supplied by manual actuation, approximately once per hour during the whole pulling upward process. The magnitude of this identification input signal $u_{Ti}$ may be within the range of, for example, −3.0~3.0 [° C.]. The diameter of the single crystal ingot 116 which is being pulled up comes to be maintained at the specified target value in a satisfactory manner by the above described feed forward compensation signal and the above described identification input signal $u_{Ti}$. By this identification experiment, input and output data are obtained in the neighborhood of the operational point when the single crystal ingot 116 is pulled upwards at the pulling up speed (a crystal growth speed) which is set in advance. Here, the input data is the actuation value $u_T$ of the heater temperature (i.e. of the melt temperature), while the output data is the pseudo diameter dw/dt (the differential of the weight w) of the single crystal ingot 116 which is pulled upward, both being obtained as functions of the single crystal ingot length (or of the elapsed time).

The process conditions used in this identification experiment are the same as the process conditions used for the control system shown in FIG. 2, which is designed based upon the results of this identification experiment. A concrete example of these process conditions will now be cited in the following. The pulling upward speed was varied within the range of 0.8~0.4 [mm/min]; the single crystal ingot rotational speed was varied within the range of 6~15 [rpm]; the argon supply flow amount was varied within the range of 20~100 [l/min]; the intensity of the magnetic field was varied within the range of 0.1~0.4 [T] (=1000~4000 [G]), and moreover the rotational speed of the crucible was varied within the range of 0.8~3 [rpm]. As already explained, the pulling upward speed was changed along with the length through which the single crystal ingot had been pulled upwards (or the elapsed time), according to a time series of the speed set value which was set in advance so that the temperature gradient at the interface between the solid and the liquid attained an adequate value. The numerical values described above of the process conditions are only examples, and it would also be possible to employ process conditions having other numerical values; in the following explanation, the process conditions of one or more types which were employed are denoted by pi (where i=0, 1, 2, . . . ).

1.2 Model Construction

A model obtained by using the identification technique described above must be a model which takes the control system design into consideration. By contrast, a controlled object (system) having complicated nonlinear or time variant characteristics is proposed by the technique of description as a set of piecewise linear systems, or by the Just-In-Time modeling technique or the local modeling technique or the like. A CZ device, which has extremely complicated nonlinearity, may be described as in the following Equation:

$$G(s) = \frac{k_0\{l(t), p_i\}[1+\Delta k_0]}{1+T\{l(t), p_i\}[1+\Delta T]s} e^{-L\{l(t),p_i\}[1+\Delta L]s} \quad (1)$$

$$|\Delta k_0| < \gamma_{k0},$$

$$|\Delta T| < \gamma_T,$$

$$|\Delta L| < \gamma_L$$

Here, G(s) is the transfer function of the controlled object 200. $k_0\{\ldots\}$, $T\{\ldots\}$, and $L\{\ldots\}$ are respectively the process gain, the time constant, and the dead time of the controlled object 200. $\Delta k_0$, $\Delta T$, and $\Delta L$ are the uncertainties in these system parameters, and their upper limits are defined by $\gamma_{k0}$, $\gamma_T$, and $\gamma_L$. l(t) is the length through which the single crystal ingot 116 has been pulled upward, while $p_i$ (i=0, 1, 2, . . . ) are the process conditions and t is the time. In the state in which PID control of the pulling upward speed has been eliminated, the length l(t) of the single crystal ingot 116 is given in advance as a function of the time. Due to this, Equation (1) may be considered as a time variant system.

1.3 Application of the Extended Least-Squares Method

As a technique for identification of time variant system parameters in circumstances where unknown disturbances are present, it is possible to utilize the recursive type extended least-squares method, using forgetting factor. However, for the command value $u_T$ of the heater temperature (the melt temperature) which is inputted, the temperature when dislocation is eliminated from the growing portion of the crystal in the necking process is taken as the equilibrium point. The upper limit values of the uncertainties, defined by $\gamma_{k0}$, $\gamma_T$, and $\gamma_L$, are each approximately 0.25 (25%).

2. Sliding Mode Control with Nonlinear State Predictor

In the case of CZ equipment which has a large dead time and nonlinearity, with the conventional control techniques based upon PID control, it was not possible to implement high performance for controlling a diameter, only with control of the heater temperature (i.e. the melt temperature). Moreover, with conventional control techniques, robustness and adaptivity have been low, due to differences in operating technique between different operators, performance differences between different sets of CZ equipment, and differences in various process conditions. Thus, in this embodiment, by applying SMC which has high robustness and adaptivity to disturbances and modeling errors, a SMC with nonlinear state predictor is employed which constrains the state after dead time, predicted based upon a nonlinear model, to a switching hyper plane.

2.1 System Description

In order to reduce chattering in the SMC caused due to the observation noise, two low pass filters were added to Equation (1) above, in which the uncertainty has been eliminated, as in the following Equation:

$$G_d(s) = \frac{k_0\{l(t), p_i\}}{1 + T\{l(t), p_i\}s} \frac{1}{1 + L_{f1}s} \frac{1}{1 + L_{f2}s} e^{-L_d\{p_i\}s} \quad (2)$$

Here, Lf1 is the time constant of the low pass filter of the inexact differentiator (the block 204 shown in FIG. 2) which converts the measured weight to the pseudo diameter. And Lf2 is the time constant of a low pass filter which is provided internally to a nonlinear state predicting unit, which will be described hereinafter.

Figure 4:
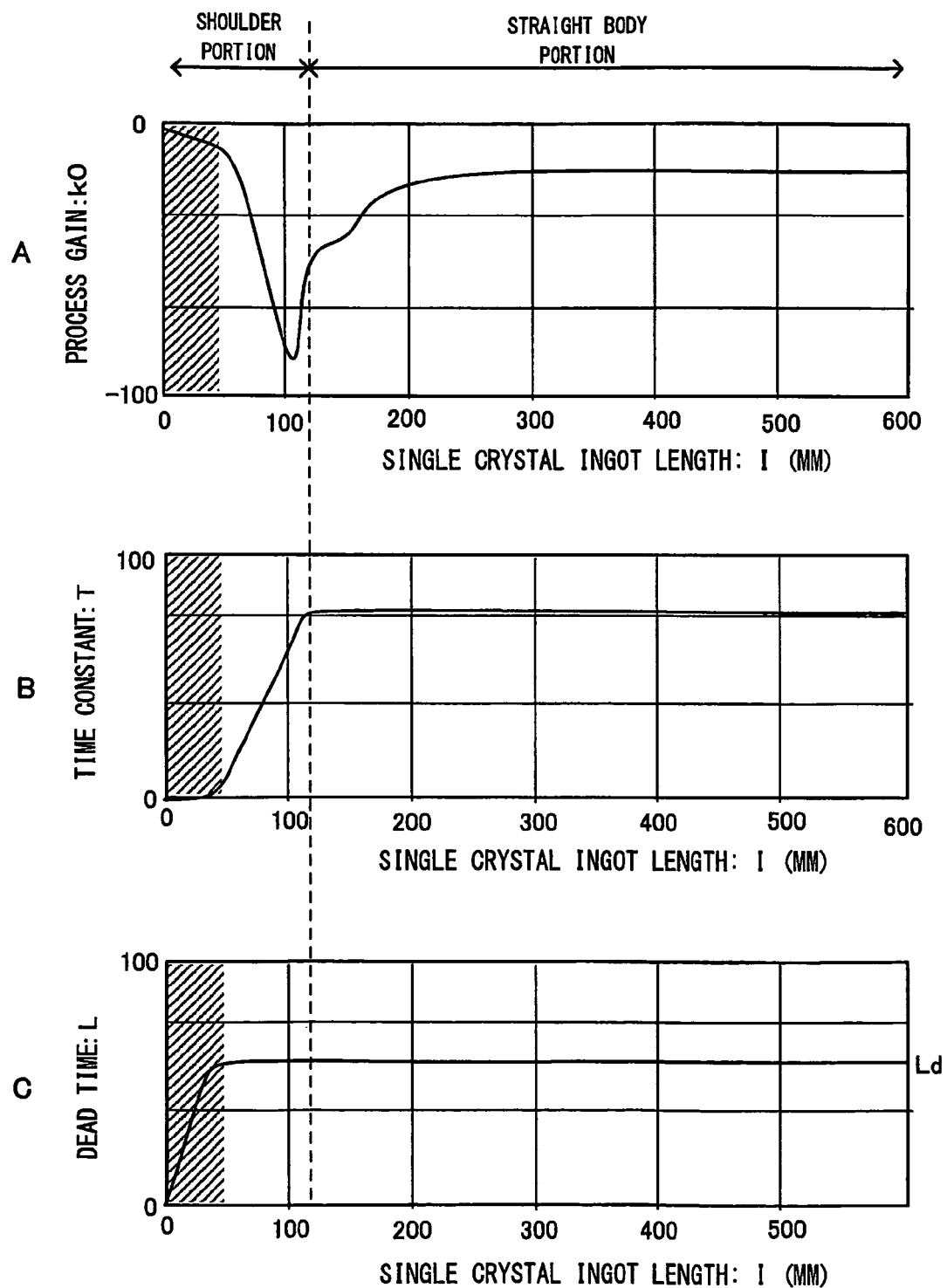
FIG. 4 is a figure showing concrete examples of process gain, time constant, and dead time of a controlled object 200, obtained from identification experiments.

The process gain $k0\{l(t), pi\}$, the time constant $T\{l(t), pi\}$, and the dead time $L\{l(t), pi\}$ which are obtained from the results of the identification experiment described above have characteristics like those, for example, shown in FIG. 4 (in which the respective vertical axes are expressed as percentages with respect to the ranges of the numerical values of the respective variables). In FIG. 4, the initial pulling up region (the region marked with hatching) in which the single crystal ingot length l(t) is less than 50 mm cannot be relied upon, since this is the stage in which the calculation by the least squares method is only partway completed; but, in the region above 50 mm, the identification result can be relied upon. Moreover, the position shown by the broken line (for example where l(t)=approximately 120 mm) is the position where the straight body formation starts. As will be understood from FIG. 4, the process gain $k0\{l(t), pi\}$ changes according to the length l(t) of the single crystal ingot, and above all changes prominently in the region from the shoulder portion of the single crystal ingot 116 to the first portion of its straight body portion (for example in the region l(t)=0~approximately 300 mm). In other words, in the process of growing the shoulder portion, the process gain $k0\{l(t), pi\}$ decreases until a position a little before entering the straight body portion, thereafter elevates, and may be considered to maintain an almost constant value after the stage at which the growth of the earlier portion of the straight body portion has been completed (for example where l(t)=approximately 300 mm). Here, the change of the process gain $k_0\{l(t), pi\}$ in the straight body portion may be considered to accompany change of the pulling up speed. Furthermore, the time constant $T\{l(t), pi\}$ elevates in the process of growing the shoulder portion, and may be considered to maintain an almost constant value after entry into the straight body portion. Moreover, from start to finish, the dead time $L\{l(t), pi\}$ may be considered as a constant value $Ld\{pi\}$ which does not depend upon the single crystal ingot length l(t). It should be understood that the characteristics of the process gain $k_0\{l(t) pi\}$, of the time constant $T\{l(t), pi\}$, and of the dead time $L\{l(t), pi\}$ shown in FIG. 4 are only cited as one example, and if the process conditions of the controlled object are different, these characteristics may be different. For example, sometimes it is possible for the dead time $L\{l(t), pi\}$ not to be a constant value, but rather also to exhibit some time variant characteristics, in a similar manner to the process gain $k_0\{l(t) pi\}$ and the time constant $T\{l(t), pi\}$. Or sometimes it is possible for the process gain $k_0\{l(t), pi\}$ or the time constant $T\{l(t), pi\}$ to be considered as being constant.

When Equation (2) is rewritten into the state equation of canonical form, it becomes the following Equations (3) through (6). However, since the process condition pi is already known, here $k_0\{l(t), pi\} \equiv k_0(t)$, $T\{l(t), pi\} \equiv T(t)$, and $Ld\{pi\} \equiv Ld$.

$$\dot{x}(t) = A(t)x(t) + B(t)u(t - L_d) \quad (3)$$

$$y(t) = Cx(t) \quad (4)$$

$$x(t) = [x_1(t) \; x_2(t) \; x_3(t)]^T \quad (5)$$

$$A(t) = \begin{bmatrix} 0 & 1 & 0 \\ 0 & 0 & 1 \\ -\dfrac{1}{T(t)L_{f1}L_{f2}} & -\dfrac{T(t) + L_{f1} + L_{f2}}{T(t)L_{f1}L_{f2}} & -\dfrac{T(t)L_{f1} + L_{f1}L_{f2} + L_{f2}T(t)}{T(t)L_{f1}L_{f2}} \end{bmatrix},$$

$$B(t) = \begin{bmatrix} 0 \\ 0 \\ \dfrac{k_0(t)}{T(t)L_{f1}L_{f2}} \end{bmatrix}, \quad (6)$$

$$C = [1 \; 0 \; 0]$$

2.2 Control System Design

First, in order to exclude steady-state error, a type-1 servo system (an augmented system) which uses an augmented state variable $x_s(t)$, in which the integrated value z(t) of the difference between the target value r(t) and the output y(t) is added to the state variable x(t) of Equation (3), is constructed in the following manner:

$$\dot{x}_s(t) = A_s(t)x_s(t) + B_s(t)u(t - L_d) + Q_s r(t) \quad (7)$$

$$x_s(t) = [z(t) \; x_1(t) \; x_2(t) \; x_3(t)]^T \quad (8)$$

$$A_s(t) = \begin{bmatrix} 0 & -1 & 0 & 0 \\ 0^{3 \times 1} & & A(t) & \end{bmatrix},$$

$$B_s(t) = \begin{bmatrix} 0 \\ B(t) \end{bmatrix}, \quad Q_s = \begin{bmatrix} 1 \\ 0^{3 \times 1} \end{bmatrix}$$

$$A_s(t) \in R^{4 \times 4}, \; B_s(t) \in R^{4 \times 1}, \; Q_s \in R^{4 \times 1} \quad (9)$$

Next an equivalent control system is designed using Equation (7). If a dead time Ld exists, the equivalent control system generally has an infinite number of poles, and it is not possible to adjust all of them with the S which will be described hereinafter. Accordingly, the equivalent control system is designed by using the following Equation, in which the time of Equation (7) has been advanced by just the dead time Ld.

$$\dot{x}_s(t+L_d) = A_s(t+L_d)x_s(t+L_d) + B_s(t+L_d)u(t) + Q_s r(t+L_d) \quad (10)$$

Here, the switching function σ(t+Ld) in which the time has been advanced by just Ld is defined as in the following Equations:

$$\sigma(t+L_d) = S x_s(t+L_d) \quad (11)$$

$$S = [S_1 S_2 S_3 S_4] \quad (12)$$

In the sliding mode of the continuous time system, from the following Equation:

$$\sigma(t+L_d) = \dot{\sigma}(t+L_d) = 0 \quad (13)$$

, if the equivalent control input ueq(t) is supposed to take no account of disturbance, we obtain the following Equation:

$$u_{eq}(t) = -\{SB_s(t+L_d)\}^{-1}\{SA_s(t+L_d)x_s(t+L_d) + SQ_s r(t+L_d)\} \quad (14)$$

and the equivalent control system is given by the following Equation:

$$\dot{x}_s(t+L_d) = [I - B_s(t+L_d)\{SB_s(t+L_d)\}^{-1}S] \times A_s(t+L_d) \quad (15)$$

$$x_s(t+L_d) + [I - B_s(t+L_d)\{SB_s(t+L_d)\}^{-1}S] \times Q_s r(t+L_d)$$

In the design of the switching hyper plane, a pole assignment method is applied which can assign the poles λ1, λ2, and λ3 of a three dimensional system, which has been dimensionally reduced to the number of inputs of the equivalent control system, to the desired characteristics. At this time, the characteristic equation of the closed loop system becomes $s^3 + S3s^2 + S2s - S1 = 0$. Here, the point to which attention must be paid is that it is possible to design this characteristic equation in a simple manner without including the time variant system parameters.

Finally, the sliding mode controller is designed. The control input u(t) is supposed to be made up from two independent control inputs, an equivalent control input ueq(t) and a nonlinear control input unl(t), as in the following Equation:

$$u(t) = u_{eq}(t) + u_{nl}(t) \quad (16)$$

$$= -\{SB_s(t+L_d)\}^{-1}\{SA_s(t+L_d)x_s(t+L_d) +$$

$$SQ_s r(t+L_d)\} - K$$

$$\{SB_s(t+L_d)\}^{-1} \frac{\sigma(t+L_d)}{\|\sigma(t+L_d)\| + \delta}$$

If K>0 is chosen when SBs(t+Ld)>0, and K<0 when SBs(t+Ld)<0, then the condition that a sliding mode exists in which the time is advanced by just Ld, the following Equation:

$$\sigma(t+L_d)\dot{\sigma}(t+L_d) < 0 \quad (17)$$

is satisfied.

2.3 The Nonlinear State Predicting Unit

The state of the nonlinear process expressed as in Equation (3), just the dead time Ld before, may be derived as below.

$$\frac{d}{dt}\{e^{-\int A(t)dt}x(t)\} = e^{-\int A(t)dt}[\dot{x}(t) - A(t)x(t)] \quad (18)$$

$$= e^{-\int A(t)dt}\left\{\begin{array}{c}A(t)x(t) + B(t)u(t-L_d) - \\ A(t)x(t)\end{array}\right\}$$

$$= e^{-\int A(t)dt}B(t)u(t-L_d)$$

When both sides of Equation (18) are integrated by time t~t+Ld, the following Equation:

$$e^{-\int_0^{t+L_d} A(t)dt}x(t+L_d) - e^{-\int_0^{t} A(t)dt}x(t) = \quad (19)$$

$$\int_t^{t+L_d} e^{-\int_0^{\tau} A(\tau)d\tau} B(\tau)u(\tau - L_d)d\tau$$

results.

By this, if the future state after time delay Ld is supposed to be xM(t+Ld), then the following Equation:

$$x_M(t+L_d) = \quad (20)$$

$$e^{\int_t^{t+L_d} A(t)dt}x(t) + \int_t^{t+L_d} e^{\int_\tau^{t+L_d} A(\tau)d\tau} B(\tau)u(\tau - L_d)d\tau$$

results. However, Equation (20) is an equation which has been derived under the preliminary supposition that the behavior of change of the system parameters is known in advance. Moreover, in Equation (20), the influence of modeling error and disturbance is compensated by using the difference between the actually measured value x(t) at the present time instant t and the predicted value xM(t). Due to this, application to an actual process having a large dead time of ten minutes or greater becomes possible.

$$x(t+L_d) = x_M(t+L_d) + x(t) - x_M(t) \quad (21)$$

However, in order to enhance the robustness and the stability against observation noise and modeling error during application to an actual process, a low pass filter of time constant sufficiently larger than the dead time Ld is applied to the difference between the actually measured value x(t) and the predicted value xM(t) of Equation (21).

The control system of SMC with nonlinear state predictor which is designed by the above is the one shown in FIG. 2 and already explained. In the control system of FIG. 2, the target value r(t+Ld) of the pseudo diameter and the set value $u_v$ of the pulling up speed are set in advance in the controller 104 as nonlinear functions of the single crystal ingot length l(t) (or of the elapsed time t from the start of pulling up), and are stored in the memory 104A of the controller 104. The single crystal ingot length l(t) is set in the controller 104 in advance as a function of the elapsed time t from the start of pulling up, and is stored in the memory 104A of the controller 104. And the process gain $k_0\{l(t), pi\}$ and the time constant $T\{l(t), pi\}$, as well, are set in the controller 104 in advance as nonlinear functions of the single crystal ingot length l(t) (or of the elapsed time t from the start of pulling up), and is stored in the memory 104A of the controller 104. And, although the dead time L{l(t), pi} may also be taken as being a nonlinear function of the single crystal ingot length l(t) (or of the elapsed time t from the start of pulling up), in this embodiment, it is set in the controller 104 in advance as the constant value Ld{pi}, and is stored in the memory 104A of the controller 104. The process condition pi, as well, is set in the controller 104 in advance as a nonlinear function of the single crystal ingot length l(t) (or of the elapsed time t from the start of pulling up), (or sometimes some of the process condition variables may also be constant values), and is stored in the memory 104A of the controller 104.

With the control system shown in FIG. 2, the weight w of the single crystal ingot 116 is not controlled; instead, the pseudo diameter dw/dt is controlled. What it is desired to control is the diameter, and accordingly this type of pseudo diameter control system is employed in order to enhance the stability, since the differential element compensates the phase delay due to the integration characteristic of the weight. It should be understood that, since it is difficult to ascertain the diameter of the pulled up single crystal ingot with high accuracy by differentiating its weight w when its initial diameter is small (for example less than or equal to 40 mm), accordingly its diameter may instead be ascertained with the optical diameter measurement device 138 shown in FIG. 1. Furthermore, with this control system, PID control of the pulling up speed and feed forward compensation of the melt temperature, which must be obtained by experience from experimental results, are eliminated. In SMC, if the desired characteristic is designed as a switching hyper plane, the controlled object is constrained and adapted to equivalently desired characteristics. By doing this, it is possible to obtain the desired target response in a simple manner with a one-degree-of-freedom control system, and it is possible to eliminate feed forward compensation of the heater temperature (i.e. of the melt temperature) (in this connection, with H∞ control or the like, a two-degrees-of-freedom control system would be required).

Figure 5:
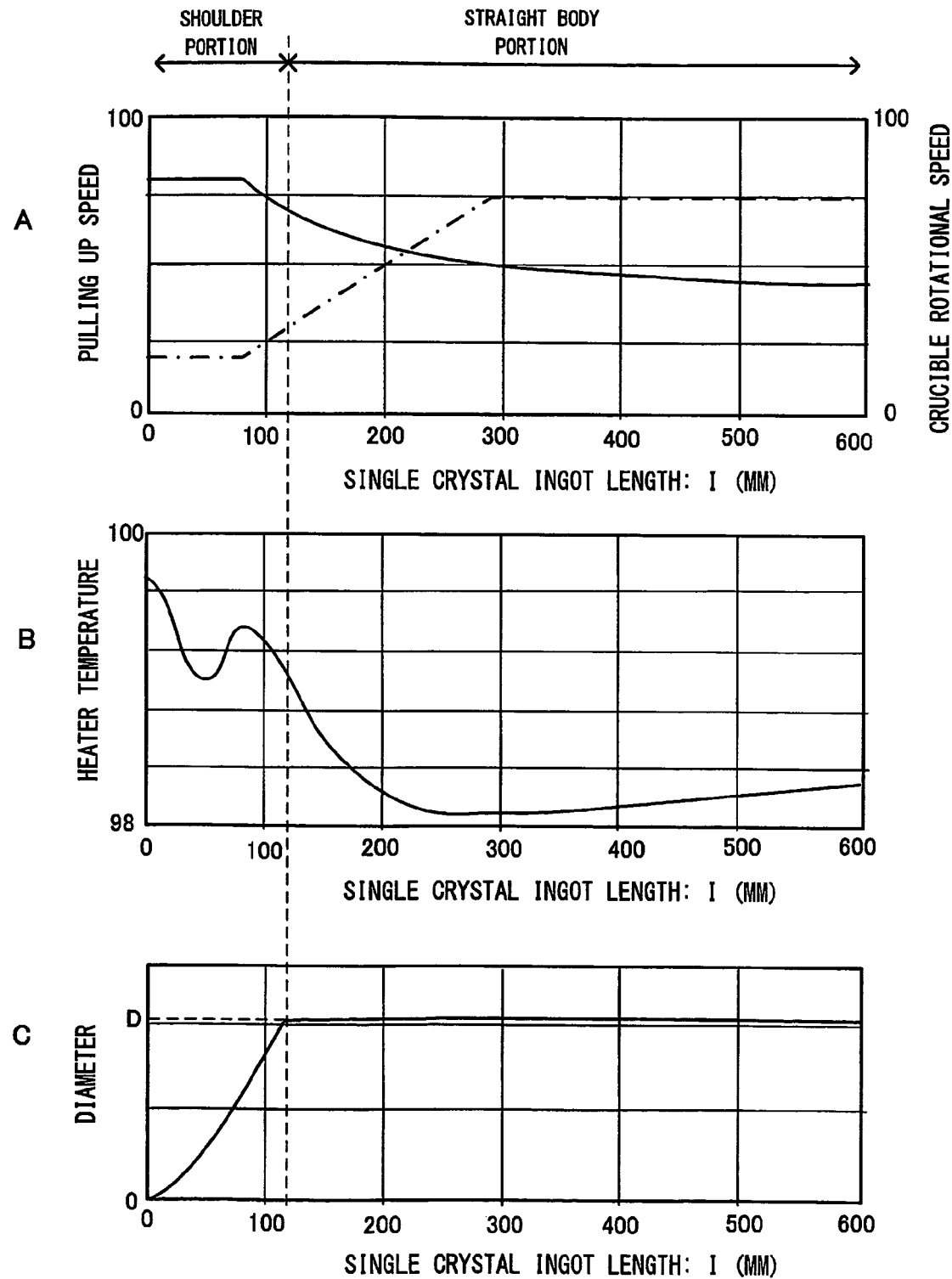
FIG. 5 is a figure showing an example of control results obtained by operationally testing the control system shown in FIG. 2.

FIG. 5 shows an example of control results obtained by operationally testing the control system shown in FIG. 2. It should be understood that the vertical axes in FIGS. 5A and 5B are expressed in percentages of the specified change ranges of the respective variant quantities, while the vertical axis in FIG. 5C is expressed as a correlation with the target diameter D of the straight body portion.

In FIG. 5A, the solid line graph shows the change of the pulling up speed along with growth of the single crystal ingot 116, while the single dotted broken line graph shows the change of the crucible rotational speed. The pulling up speed was constant in the first half of the process of growing the shoulder portion, and as the process entered the rear half, but was gradually decreased along with increase of the single crystal ingot length l from a predetermined position slightly before the position where the process entered the straight body portion, and thereafter. Furthermore, the crucible rotational speed was constant in the first half of the process of growing the shoulder portion, but was gradually increased along with increase of the single crystal ingot length l from a predetermined position slightly before the position where the process entered the straight body portion; and, when the length l of the single crystal ingot attains a predetermined value (for example, about 300 mm; this and the position where the process gain $k_0$ shown in FIG. 4A becomes almost constant almost agree with one another), and thereafter was maintained at a constant value. This change of the pulling up speed, as previously described, is that which accords with a speed set value which has been set in advance so as to maintain the temperature gradient at the interface between the solid of the single crystal ingot 116 and the liquid of the melt 112 at an adequate value. Along with the single crystal ingot 116 becoming longer, the upward heat dissipation becomes smaller so that the temperature gradient becomes smaller, but the pulling up speed is decreased in order to compensate for this, as seen in the figure.

As shown in FIG. 5B, the heater temperature (the melt temperature) was progressively decreased from the start of pulling up, but was temporarily elevated in the rear half of the process of forming the shoulder portion, reached a local maximum value at a predetermined position slightly before the above described position where the process entered the straight body portion, and thereafter was decreased for a second time. And when the single crystal ingot length l attained the above described predetermined value (for example about 300 mm), the heater temperature (the melt temperature) was gradually increased. With this type of change of the heater temperature (the melt temperature), as shown in FIG. 5C, the single crystal ingot diameter was controlled to its target value at high accuracy, and in particular, in the straight body portion, was controlled to an almost constant value which was almost the same value as the target value D for the straight body portion.

Moreover, as will be understood from the control results described above, the pulling up speed is maintained in a range in the neighborhood of the specified adequate value over the entire area of the shoulder portion and the straight body portion, and the temperature gradient at the interface between the solid and the liquid is maintained at an almost adequate value. As a result, the crystal product quality of the straight body portion becomes satisfactory. In other words, it is generally known that, if the pulling up speed is termed V and the temperature gradient at the above described interface is termed G, for example in the case of a single crystal ingot 116 of silicon, the density of crystal defects within the single crystal ingot 116 is determined by V/G. Since, according to the control results described above, V/G in the straight body portion is maintained in the neighborhood of an adequate value in a stable manner without fluctuating greatly, accordingly the fluctuation of the density of crystal defects is small, and the crystal product quality becomes satisfactory.

Figure 6:
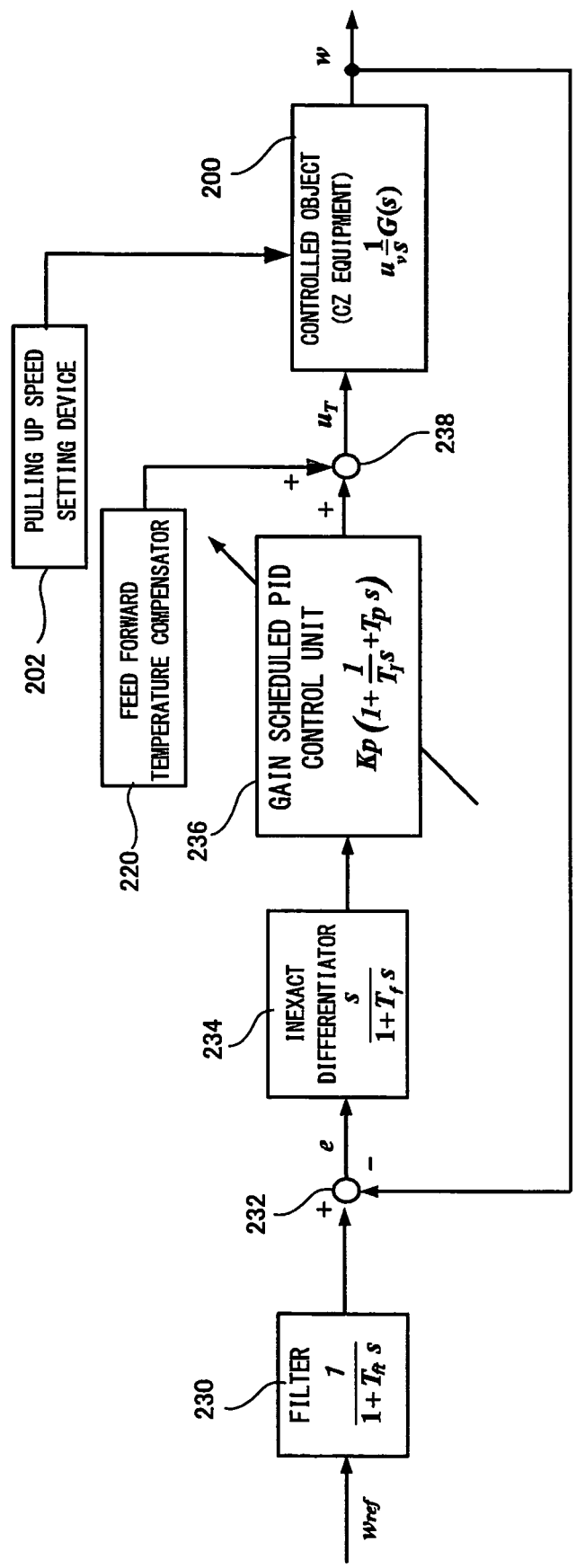
FIG. 6 is a block diagram showing a variant embodiment of the control system.

FIG. 6 shows a variant embodiment of the control system of this embodiment, which may be employed instead of the structure of FIG. 2. It should be understood that, in the control system shown in FIG. 6 as well, the process conditions, which consist of the pulling up speed and the other variables described above, are controlled in a similar manner to that with the control system shown in FIG. 2.

The control system shown in FIG. 6 uses gain scheduled PID control instead of the nonlinear state prediction SMC described above. In other words, with this control system, the single crystal ingot weight w detected from the controlled object (CZ equipment) 200, and a weight target value obtained after using a low pass filter 230 upon a single crystal ingot weight target value $w_{ref}$ which is set in the controller 104 in advance and stored in the memory 104A, are inputted to a subtractor 232, the weight deviation e is calculated, and an inexact differentiator 234 is used upon this weight deviation and a pseudo diameter deviation is calculated. And a gain scheduled PID control unit 236 is applied to this pseudo diameter deviation. Each of the proportional gain $K_P$, the integration gain $T_I$, and the differential gain $T_D$ of this gain scheduled PID control unit 236 is determined in advance as a function of the single crystal ingot length l(t) (or of the elapsed time), based upon the process gain $k_0(t)$, the time constant T(t), and the dead time L(t) which the controlled object 200 shown by way of example in FIG. 4 has (as previously described, the dead time L(t) is considered as being a constant value Ld), which change according to the single crystal ingot length l(t) (or according to the elapsed time), and is set into the controller 104 and stored in the memory 104A within the controller 104. And the gain scheduled PID control unit 236 performs PID calculation using the gains $K_P$, $T_I$, and $T_D$ which change according to the single crystal ingot length l(t) (or according to the elapsed time). It should be understood that it would also be acceptable to arrange to set, among these three control gains, only the proportional gain $K_p$ as a function of the single crystal ingot length l(t) (or of the elapsed time), and to set the integration gain $T_I$ and the differential gain $T_D$ to constant values.

The PID calculated result value which is outputted from the gain scheduled PID control unit 236 and a temperature compensation value which is outputted from a feed forward temperature compensator 220 are added together by an adder 238, and the result of this addition is applied to the controlled object (the CZ equipment) 200 as an actuation value $u_T$ for the heater temperature (i.e. for the melt temperature). Here, this feed forward temperature compensator 220 is the same as the feed forward temperature compensator which was used in the identification system shown in FIG. 3, and it outputs a temperature compensation value which is obtained experimentally and set in advance, and which changes according to the single crystal ingot length l(t) (or according to the elapsed time). If it is not possible to make the single crystal ingot weight w agree with the reference weight value $w_{ref}$ only with the temperature compensation value which is outputted from the feed forward temperature compensator 220, then, by the gain scheduled PID control unit 236 performing compensation, the single crystal ingot weight w comes to be controlled more accurately to the reference weight value $w_{ref}$.

Figure 7:
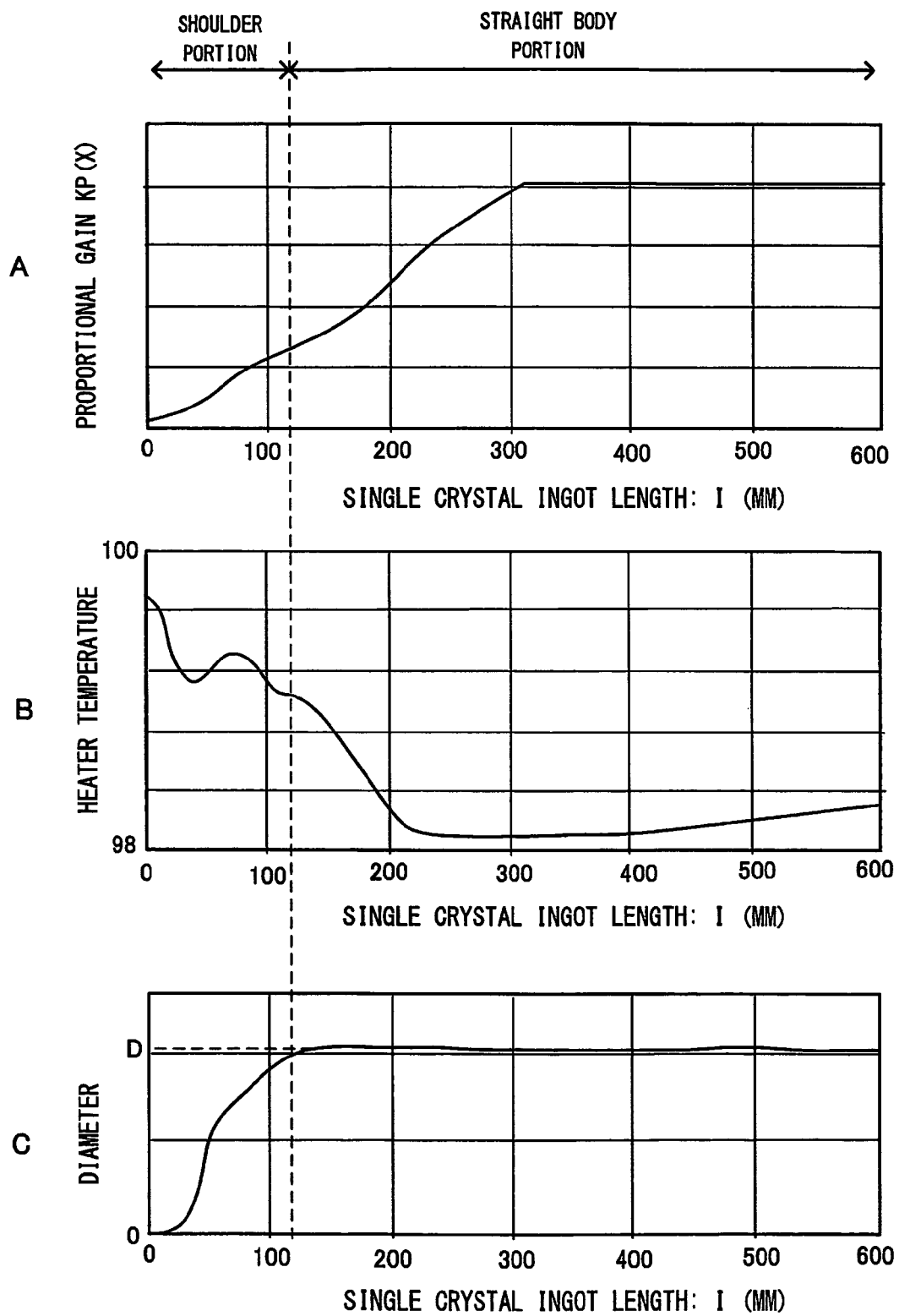
FIG. 7 is a figure showing an example of control results obtained by operationally testing the control system shown in FIG. 6.

FIG. 7 shows an example of operational results of control which was actually performed by the control system shown in FIG. 6. It should be understood that the vertical axes in FIGS. 7A and 7B are expressed in percentages of the specified change ranges of the respective variant quantities, while the vertical axis in FIG. 7C is expressed as a correlation with the target diameter D of the straight body portion.

As shown in FIG. 7A, the proportional gain $K_p$ of the gain scheduled PID control unit 236 is increased during the time period from the start of pulling up until the single crystal ingot length l reaches a predetermined value (for example 300 mm) (in other words, while the process gain $k_0$ shown in FIG. 4A fluctuates), and thereafter is maintained at a constant value (in other words, after the process gain $k_0$ shown in FIG. 4A has stabilized at an almost constant value). As shown in FIG. 7B, while the heater temperature is decreased from the start of pulling up, it is temporarily elevated in the later half of the process of formation of the shoulder portion, attains a locally maximum value at a predetermined position slightly before the position where it enters into the straight body portion, thereafter decreases for a second time, and is gradually increased after the single crystal ingot length l attains the above described predetermined value. The behavior of this change is fundamentally the same as the behavior of the change of the heater temperature due to SMC with nonlinear state predictor, shown in FIG. 5B. As a result the single crystal ingot diameter is controlled satisfactorily, as shown in FIG. 7C. However, as will be understood by comparison with FIG. 5C, with the SMC with nonlinear state predictor, a superior controllability of the diameter is obtained.

According to these control results, if the pulling up speed is termed V and the temperature gradient at the above described interface is termed G, then the crystal product quality of the single crystal ingot 116 is satisfactory, since V/G does not fluctuate greatly in the straight body portion but is maintained stably in the neighborhood of an appropriate value.

Although the present invention has been explained above in terms of various embodiments, this is only given by way of example; various variants of the present invention may also be applied. For example, instead of the method of controlling the heater temperature (the melt temperature) by feedback control, as in the embodiments described above, it would also be possible to employ a control method in which a pattern of change of the heater temperature (or of the melt temperature) as shown by way of example in FIG. 5B or in FIG. 7B is set as a function of the single crystal ingot length or of the elapsed time, and the heater temperature (or the melt temperature) is changed in correspondence to the single crystal ingot length or the elapsed time, according to this set temperature value.

Furthermore, the controlled object of the control system according to the present invention is not to be considered as being limited only to the above described single crystal puller; it goes without saying that it is also possible to apply the present invention to various other types of controlled object having dead time and/or time variant characteristics. For example, in a system which remotely actuates a manipulator of a robot or of a working machine via a communication network, the communication delay of the communication network or the response delay of a hydraulic circuit or the like is present as dead time. The control system of the present invention is also appropriate as an actuation system for this type of manipulator. Or, with the RCA cleaning system which has been developed by RCA (Radio Corporation of America) which is widely used as a silicon wafer washing method in semiconductor manufacturing processes, a large dead time and/or nonlinear time variant characteristics are present in the temperature control of the cleaning liquid. The control system of the present invention is also appropriate of application to this RCA cleaning system.

Figure 8:
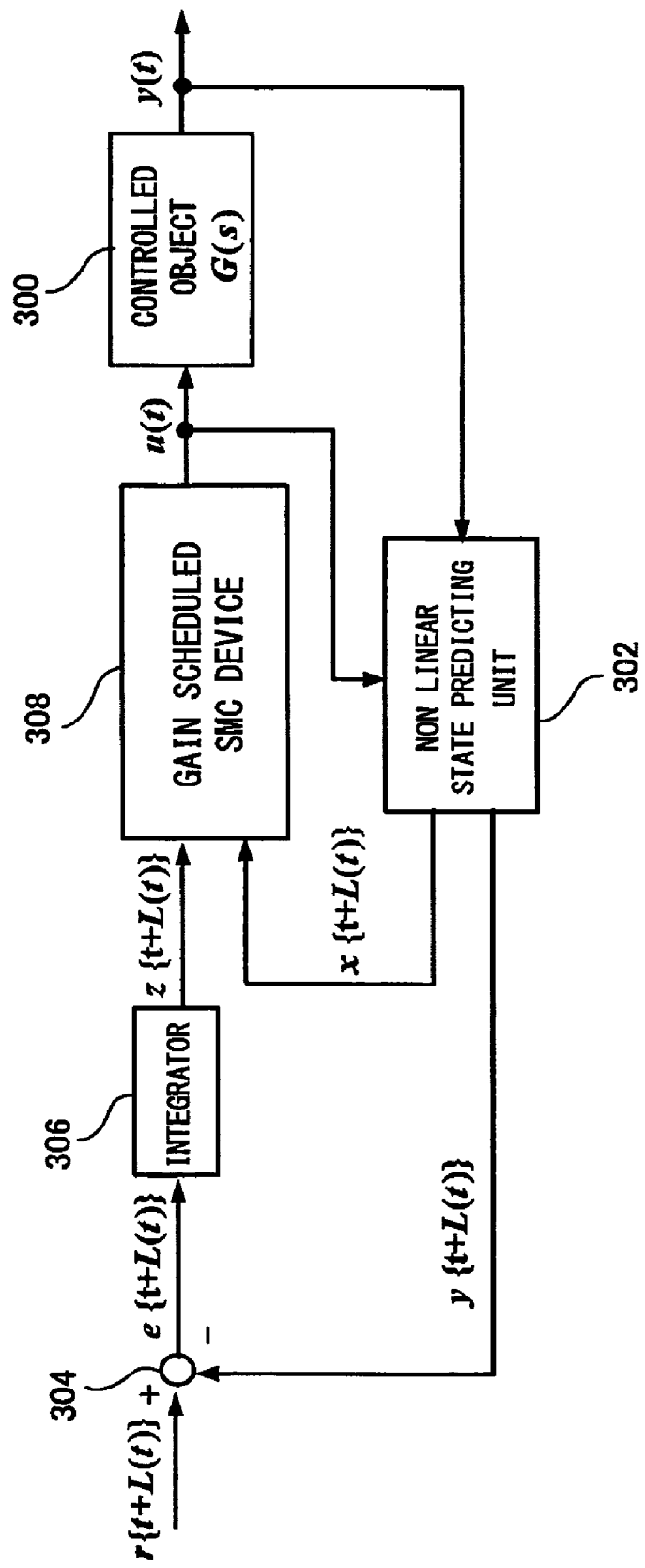
FIG. 8 is a block diagram showing the overall structure of a general purpose control system according to a SMC method with nonlinear state predictor, according to the present invention.

FIG. 8 shows the overall structure of a general purpose control system according to a SMC method with nonlinear state predictor, according to the present invention.

In FIG. 8, the block 300 represents a controlled object (which, as described above, may be a system of various types). The control system comprises blocks 302 through 308. System parameter set values each of which expresses a system parameter (process gain, time constant, dead time and the like) of the controlled object 300, and target value, are stored in advance in this control system. All of these system parameter set values and target value may be set so as to have specified time variant characteristics corresponding to the particular controlled object 300, for example as functions of specified variables which express the elapsed time or the state of progress of control, (of course, sometimes it is also possible for some of these system parameters to be set to constant values). A nonlinear state predicting unit 302 inputs the output value y(t) and the input value u(t) of the controlled object 300, and forecast calculates the specified state variable vector x{t+L(t)} at the future time instant {t+L(t)} after a specified dead time L (t) has elapsed from the present time instant, using the set values of the system parameters which are stored in advance. Here, the output value y(t) of the controlled object 300, and the first through the N-th order differential values of this output value y (t) with respect to time, may be included in the state variable vector x(t).

A subtractor 304 inputs the output value y{t+L(t)} at the future time instant {t+L(t)} which has been predicted by the nonlinear state predicting unit 302 and the target value r{t+L (t)} at that future time instant {t+L (t)}, and calculates the deviation e{t+L(t)} between the two of them. And an integrator 306 inputs the deviation e{t+L(t)} from the subtractor 306, integrates this deviation e{t+L(t)} with respect to time, and thereby obtains the integrated value z{t+L(t)} of the deviation e{t+L(t)} outputted from the subtractor 304 during the period from the start of control until the present time instant.

And a gain scheduled SMC device 308 inputs the state variable vector x{t+L (t)} at the future time instant {t+L (t)} from the nonlinear state predicting unit 302 and the integrated value z{t+L (t)} of the deviation e{t+L (t)} from the integrator 306, and executes SMC operation of the type-1 servo system, using the augmented state variable in which the integrated deviation value z{t+L(t)} is added to the state variable vector x{t+L(t)} at the future time instant {t+L(t)}, and using the set values of the system parameters at the future time instant {t+L (t)} which are stored in advance (i.e. the process gain set value k0{t+L(t)}, the time constant set value T{t+L(t)}, and the dead time set value L{t+L (t)}). By doing this, the augmented state variable vector x{t+L(t)} at the future time instant {t+L (t)} is constrained in sliding mode. By this SMC operation, the actual actuation value u(t) is determined and is applied to the controlled object 300.

The scope of the present invention is not to be considered as being limited only to the embodiments described above. The present invention may be implemented in various other manners, provided that its gist is not departed from.

The invention claimed is:

1. A control system for a controlled object in a time variant system with dead time, comprising:
   a storage device which stores a target value (r) for an output value of said controlled object and a plurality of system parameter preset values which represent a plurality of system parameters of said controlled object, and is configured so that all or a part of said plurality of system parameter preset values have specified time variant characteristics;
   a state predicting unit which, based on said system parameter preset values stored in said storage device, and an output value at the present time instant and an input value ($u_T$) in the past of said controlled object, predicts the value of a specified state variable (x), including said output value, at a future time instant (t+L) which is later than the present by exactly said dead time; and
   a sliding mode control unit which, based on said target value (r) at the future time instant (t+L) stored in said storage device, said system parameter preset values, and said state variable (x) at the future time instant (t+L) predicted by said state predicting unit, performs sliding mode control operation so as to constrain said state variable (x) at the future time instant (t+L) to sliding mode of the future time instant (t+L), and outputs an actuation value (u) which is to be applied to said controlled object.

2. A system according to claim 1, further comprising an integrator which integrates the deviation (e) between said output value at the future time instant (t+L) predicted by said state predicting unit and said target value (r), and obtains an integrated deviation values (z) at the future time instant (t+L);
   wherein said sliding mode control unit performs sliding mode control operation using an augmented state variable ($x_s$) made by appending said integrated deviation value (z) at the future time instant (t+L) from said integrator to said state variable (x) at the future time instant (t+L) from said state predicting unit.

3. A single crystal production device comprising:
   a control system according to claim 1; and
   a single crystal puller which is controlled by said control system, and which manufactures a single crystal ingot by the Czochralski method,
   wherein:
      said output value is the value of the diameter of a single crystal ingot which is being pulled up by said single crystal puller;
      said system parameter preset values having specified time variant characteristics are set so as to change according to the length of the single crystal ingot which is being pulled up by said single crystal puller, or according to elapsed time;
      said state variable (x) includes said diameter value and the first order and second order differential values of said diameter value with respect to time; and
      said actuation value (u) is a numerical value to which is actuated the melt temperature of said single crystal production device, or the temperature of a heater which applies heat to the melt;
   said single crystal production device further comprising a pulling up speed setting device which controls the pulling up speed of said single crystal ingot according to a pulling up speed preset value which is set in advance as a function of time.

4. A single crystal production device according to claim 3, wherein one said system parameter preset value having specified time variant characteristic is process gain preset value ($k_0$), and said process gain preset value ($k_0$) is set so as to change according to the length of said single crystal ingot in the process of formation of the shoulder portion and the straight body portion of said single crystal ingot, and so as to change according to change of the pulling up speed of said single crystal ingot in the process of formation of said straight body portion.

5. A control method for controlled object in a time variant system with a dead time, comprising:
   a step of storing a target value (r) for an output value of said controlled object and a plurality of system parameter preset values which represent a plurality of system parameters of said controlled object, and configuration so that all or a part of said plurality of system parameter preset values have specified time variant characteristics;
   a step of, based on said stored system parameter preset values, and an output value at the present time instant and an input value ($u_T$) in the past of said control object, predicting the value of a specified state variable (x), including said output value, at a future time instant (t+L) which is later than the present by exactly said dead time; and
   a step of, based on said target value (r) at the future time instant (t+L), said system parameter preset values, and said predicted state variable (x) at the future time instant (t+L), performing sliding mode control operation so as to constrain said state variable (x) at the future time instant (t+L) to sliding mode of the future time instant (t+L), and outputting an actuation value (u) which is to be applied to said controlled object.

* * * * *